United States Patent
Boerstler et al.

[11] Patent Number: 5,852,367
[45] Date of Patent: Dec. 22, 1998

[54] SPEED ENHANCED LEVEL SHIFTING CIRCUIT UTILIZING DIODE CAPACITANCE

[75] Inventors: David William Boerstler, Millbrook; Edward Baxter Eichelberger, Hyde Park; Gary Thomas Hendrickson, Kingston; Charles Barry Winn, Hyde Park, all of N.Y.

[73] Assignee: International Business Machines Corporation, Armonk, N.Y.

[21] Appl. No.: 939,892

[22] Filed: Sep. 1, 1992

[51] Int. Cl.$^6$ ............................................. H03K 19/0175
[52] U.S. Cl. .................. 326/80; 326/126; 326/17
[58] Field of Search ..................... 307/475, 446, 307/455, 319, 320, 443

[56] References Cited

U.S. PATENT DOCUMENTS

| | | | |
|---|---|---|---|
| 2,831,987 | 4/1958 | Jones . | |
| 3,535,546 | 10/1970 | Davis | 307/455 |
| 3,909,637 | 9/1975 | Dorler | 307/320 |
| 4,430,630 | 2/1984 | Sakamoto | 307/320 |
| 4,668,882 | 5/1987 | Matsuura | 307/320 |
| 4,754,171 | 6/1988 | Dasai et al. | 307/455 |
| 4,760,289 | 7/1988 | Eichelberger | 307/455 |

FOREIGN PATENT DOCUMENTS

A2166312  4/1986  United Kingdom .

OTHER PUBLICATIONS

RADIO FERNSEHEN ELEKTRONIK, vol. 27, No. 11, Nov. 1978, East Berlin, DDR, pp. 687–691, H. E. Krobel.

Patent Abstracts of Japan, vol. 7, No. 17 (E–154) (1162) Jan. 22, 1983 & UP–A–57 176 837 (Hitachi Seisakusho K. K.) Oct. 30, 1982.

Patent Abstracts of Japan, vol. 13, No. 92 (E–722) Mar. 3, 1989 & JP–A–63 268 303 (NEC Corp.)Nov. 7, 1988.

"Microelectronic Circuits", Sedra et al., © 1987 by Holt, Rinehart and Winston, Inc., pp. 170, 171, 195 and 453.

*Primary Examiner*—Michael J. Tokar
*Assistant Examiner*—Daniel Chang
*Attorney, Agent, or Firm*—James E. Murray; Lawrence D. Cutter

[57] ABSTRACT

A level shifting circuit operating at low power with minimal signal delays. The circuit employs high capacitance diodes to shift signals from a first signal level to a second higher or lower signal level. The capacitance is obtained by either providing a discrete capacitor shunt across the diode or by using diode connected transistors. Diode connected transistors are biased to provide the necessary capacitance. A pair of high capacitance diode level shifters is used as a differential pair level shifter by connecting the reference resistors to a common reference potential.

26 Claims, 3 Drawing Sheets

FIG. 3A PRIOR ART
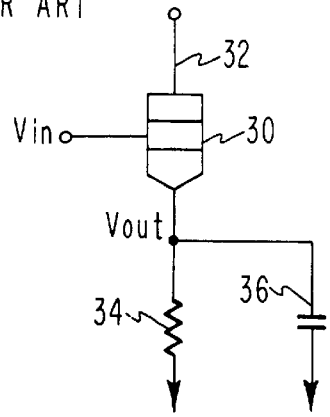
FIG. 3B PRIOR ART
FIG. 3C PRIOR ART
FIG. 4A PRIOR ART
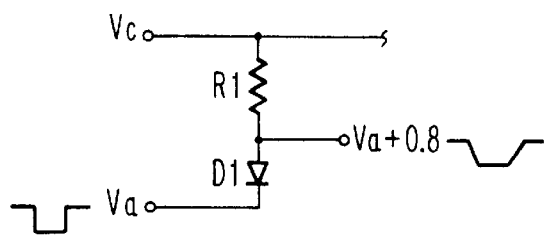
FIG. 4B PRIOR ART
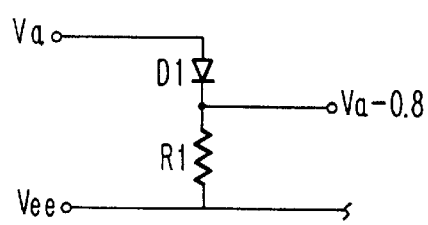
FIG. 5A
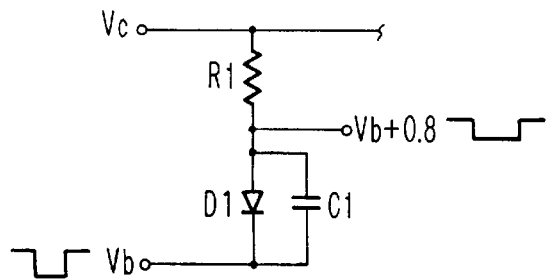
FIG. 5B
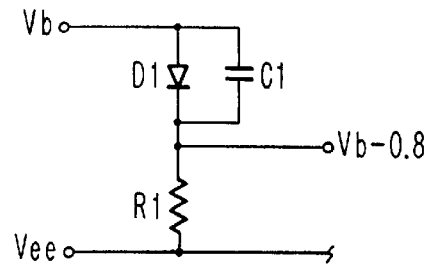

FIG. 6A
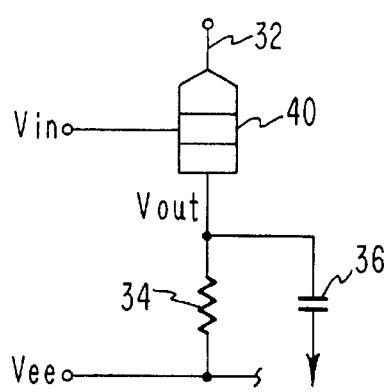
FIG. 6B
FIG. 6C
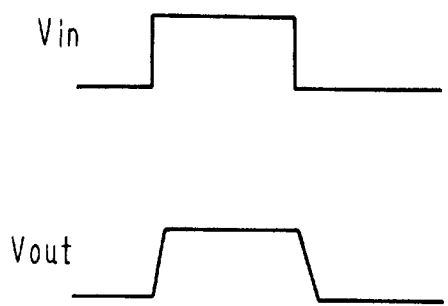
FIG. 7A
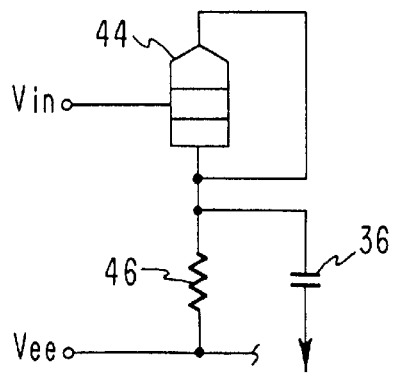
FIG. 7B
FIG. 7C
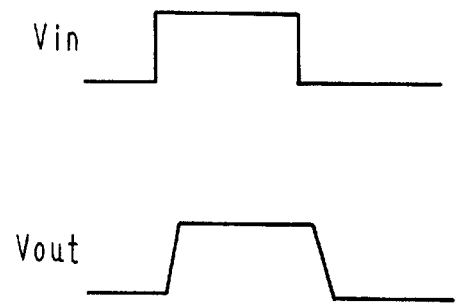
FIG. 8
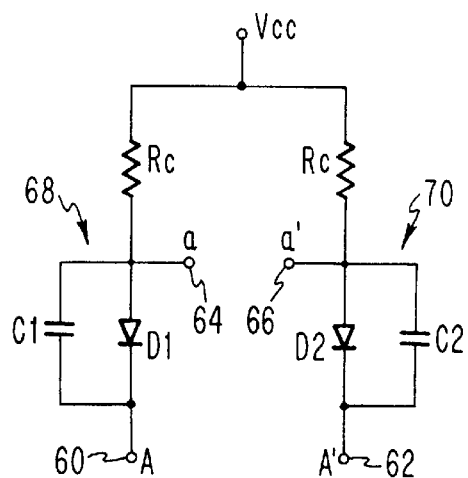
FIG. 9A   FIG. 9B   FIG. 9C
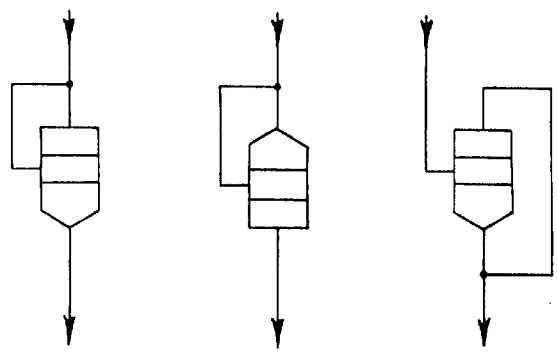

SPEED ENHANCED LEVEL SHIFTING CIRCUIT UTILIZING DIODE CAPACITANCE

BACKGROUND OF THE INVENTION

1. Field of the Invention

The present invention relates generally to solid state digital logic circuits and particularly to bipolar, emitter coupled logic (ECL) circuits. Particularly, the invention relates to improvements to differential current switch (DCS) logic circuits and more particularly to apparatus for low power voltage shifting.

2. Background and Related Art

Digital logic circuits in current generation computers are frequently implemented as VLSI circuits. Bipolar emitter coupled logic (ECL) circuits predominate and are found in, for example, the IBM ES/9000 series of large computers.

Circuit designers are continually seeking to increase the speed of logic circuits and to reduce the power consumed by such circuits. Power consumption is particularly critical in circuits having high logic density because high density creates large heat dissipation requirements that must be removed by cooling apparatus.

Differential current switch logic (DCS) circuits have been proposed to increase circuit speed without an accompanying increase in power. U.S. Pat. No. 4,760,289, to Eichelberger et al. (commonly assigned) for a "Two Level Differential Cascode Current Switch Masterslice" is an example of such a circuit and is incorporated by reference. The DCS circuit described in Eichelberger et al. improves switching speed by up to twenty percent without an increase in power.

DCS devices have been enhanced over the '289 design by incorporating a third cascode level and the circuitry necessary to provide input and output signals to each circuit level. The structure of an enhanced DCS (EDCS) circuit is shown in FIG. 1.

The output performance of most VLSI circuit technologies like EDCS is a strong function of the capacitive load or fanout of the output. The output stage 16 provides the circuitry to meet those output load requirements.

The addition of a third cascode level requires shifting of logic signals to that third level. Enhanced differential current switch logic according to the present invention is based on logic signals compatible with the middle cascode level with an upshift circuit 12 and downshift circuit 14 to adjust the signals for the other two levels. This operational principle simplifies logic design and allows use of the EDCS bookset with ECL Current Switch Emitter Follower (CSEF) signal levels.

SUMMARY OF THE INVENTION

The present invention is directed to an improved level shifting circuit for upshifting or downshifting input signals. The level shifting circuit of the present invention operates at low power with rapid response times.

The present invention is directed to a level shift circuit for translating a first voltage level from a first voltage source to a second voltage level using a resistor connected to a DC collector supply voltage $V_{CC}$, a high capacitance diode structure for creating a voltage shift connected in series with the resistor, the first voltage source being connected to the diode structure, and the second shifted voltage appearing at the resistor diode junction.

The high capacitance diode structure is formed, in one embodiment, from a diode and a capacitor shunt across the diode.

The high capacitance diode structure in other embodiments is a diode-connected transistor.

The high capacitance diode level shift circuit can be used for either a downshift circuit or an upshift circuit depending upon the direction of conductance of the high capacitance diode.

The invention is further directed to an upshift circuit for shifting a differential pair of input signals at a first signal level to a second differential pair of output signals at a second signal level using a circuit having input terminals, two high capacitance diode structures for shifting the signal level, resistors connected to the high capacitance diode structures at a connection node and to a common source potential, with the second differential signal pair appearing at the connection node.

The high capacitance diode structure above can be formed from discrete capacitor shunted diodes or from diode connected transistors biased to provide the necessary high capacitance.

It is therefore an object of the present invention to provide a level shifting circuit with low power consumption.

It is a further object of the invention to provide a level shifting circuit having rapid changes of signal in both positive and negative directions.

It is yet another object of the invention to provide a level shifting circuit with AC coupling.

The foregoing and other objects, features and advantages of the invention will be apparent from the following more particular description of a preferred embodiment of the invention, as illustrated in the accompanying drawing wherein like reference numbers represent like parts of the invention.

BRIEF DESCRIPTION OF THE DRAWING

FIG. 3(a) is a diagram of a prior art level shift circuit.

FIG. 3(b) and 3(c) show the relative responses of $V_{in}$ and $V_{out}$ respectively.

FIGS. 4(a) and 4(b) are circuit diagrams of prior art diode level shifters.

FIGS. 5(a) and 5(b) are circuit diagrams of level shifters according to one embodiment of the present invention.

FIG. 6(a) is a diagram of an inverse active transistor level shifter according to the present invention.

FIGS. 6(b) and 6(c) illustrate the $V_{in}$ and associated $V_{out}$ response.

FIG. 7(a) is a diagram of a diode connected transistor level shifter according to the present invention.

FIGS. 7(b) and 7(c) illustrate the $V_{in}$ and associated $V_{out}$ response.

FIG. 8 is a circuit diagram of a differential pair level shifter according to the present invention.

FIG. 9(a) through 9(c) are alternate embodiments of diode connected transistors for use in the preferred embodiment of the present invention.

DETAILED DESCRIPTION

The enhanced differential current switch logic family provides the basis for computer logic designs for computers such as the IBM ES/9000 computer series. This logic family is implemented using VLSI technology to provide a set of logic building blocks. The basic VLSI design approach is based on a number of cells that can be "wired" in different ways to provide a set of "books" of basic logic function. Logic functions can be 'AND', 'OR' and so forth (see Eichelberger et al. above.)

Figure 1:
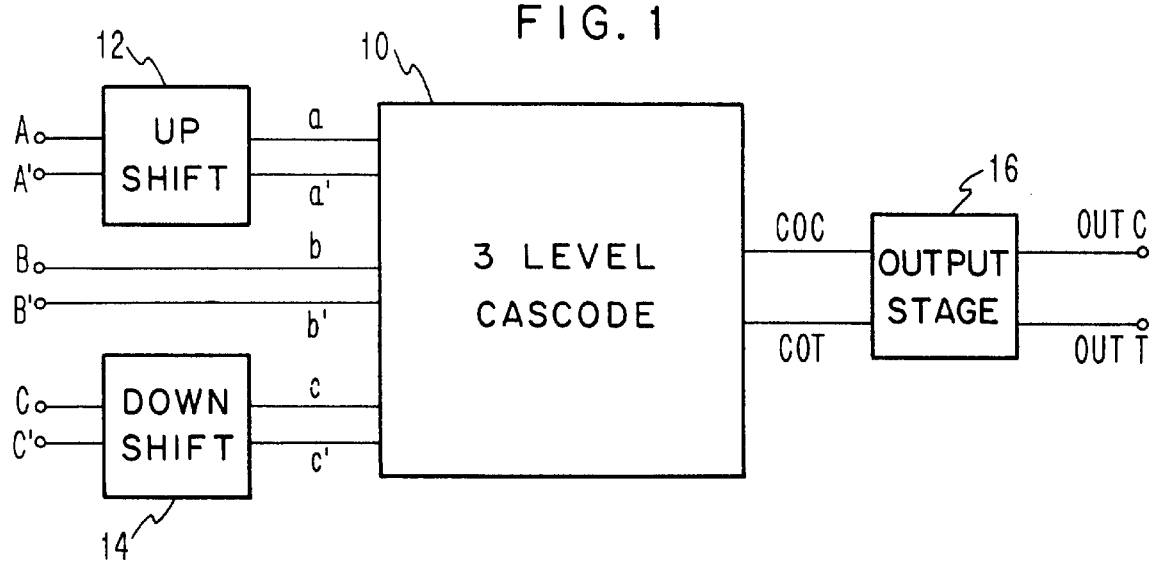
FIG. 1 is a block diagram of an enhanced differential current switch logic circuit according to the present invention.

The enhanced differential current switch shown in FIG. 1 has the advantage of having a third input level increasing the logic fan-in and function producible with that circuit.

EDCS is designed to work with existing emitter coupled logic (ECL) components. As such, it must provide appropriately loaded output signals and be able to accept inputs from ECL components. This is accomplished by maintaining input and output levels compatible with ECL current switch emitter follower (CSEF) levels. All signals are provided at the middle cascode level and must be up-shifted or down-shifted for the upper or lower cascode levels.

The basic structure of an EDCS circuit employing the present invention is shown in FIG. 1. Three level cascode logic 10 provides the basic logic of the device. Logic 10 can implement an OR, XOR, AND or similar logic function. The inputs to the EDCS circuit are A, A', B, B', C, C' (where A and A' is a differential pair and A' is the complement of A). Inputs A,A' are up-shifted by up-shift circuit 12 and inputs C, C' are down-shifted by down-shift circuit 14 to provide the necessary voltage to the cascode logic 10. Outputs COC and COT flow through output stage 16 to provide the outputs OUTC and OUTT with the necessary current to drive the capacitive load of the following logic circuit.

Figure 2:
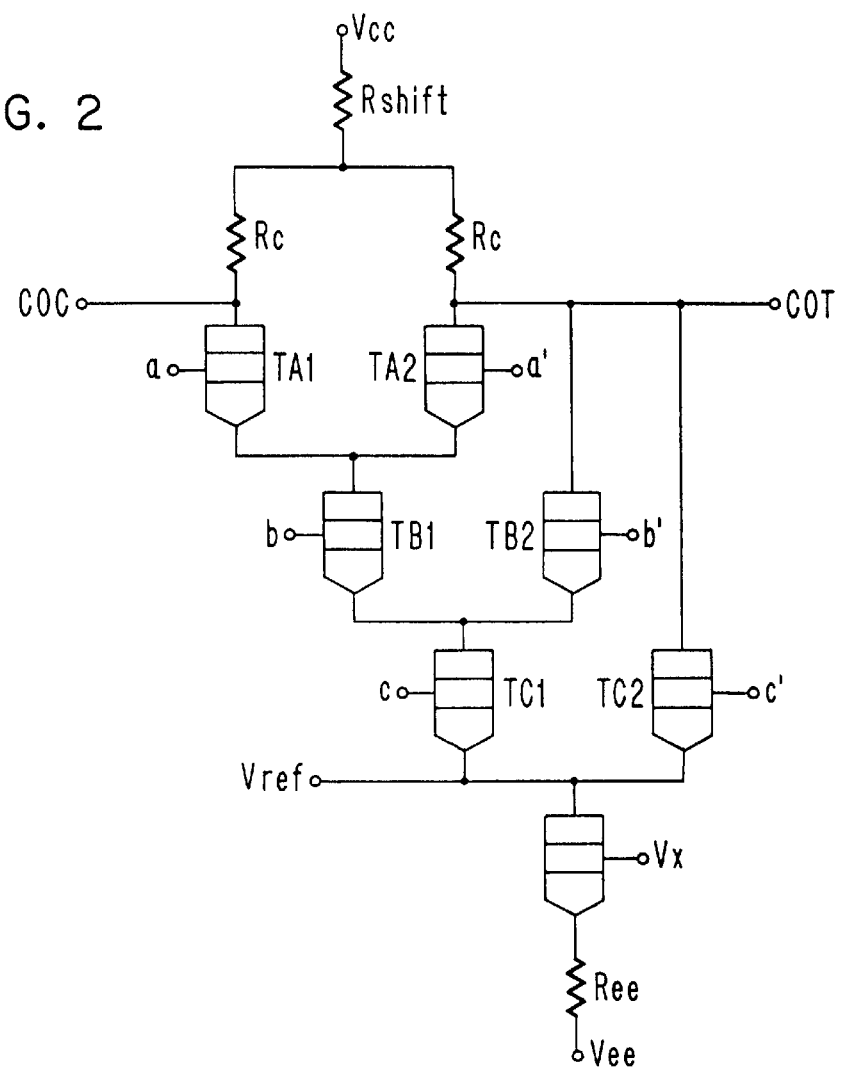
FIG. 2 is a circuit diagram illustrating an 'AND' circuit implemented using three level cascode EDCS logic.

FIG. 2 is an example of three level cascode logic that can be used with the present invention. FIG. 2 represents an 'AND' logic circuit, although EDCS can be used to provide any logic function of three variables.

In the preferred embodiment as illustrated by FIG. 2, the differential inputs are at the following levels: a/a' 1.1/0.9V; b/b' 0.3/0.1V; and c/c' −0.5/−0.7V. The supply voltage, $V_{CC}$, is 1.4V, $V_{ee}$ is 2.2V, and $V_{X}$ is −0.8V. The outputs COT/COC are 1.1/0.9V and are connected to the output stage 16. Output stage 16 drops the output level of OUTT/OUTC to 0.3/0.1V, the level compatible with the middle stage of the next circuit. $R_{shift}$ provides a constant 300 mV drop down from $V_{cc}$. The operation of the logic circuit will not be further described as it does not form part of the present invention. This AND circuit provides the logic function OUTT=A AND B AND C.

Level shifting stages 12 and 14 are required to maintain compatibility between logic gate inputs and outputs. The input voltage levels to the upper and lower cascode levels must be shifted before any logic can be performed by circuit 10. Prior art devices typically use a resistively terminated emitter follower to perform up and down level shifting. An example of such a circuit is shown in FIG. 3(a). One emitter follower circuit as shown in FIG. 3(a) would be required for each of the differential inputs, e.g. A, A'. The signal response is shown in FIGS. 3(b) and 3(c).

Level shifters provide no logic function while often consuming 15% to 20% of the power required by a particular gate. Reduction of power requirements without loss of function is therefore highly desirable.

The output drive capability of the emitter follower is good for positive transitions, but is much poorer for negative going transitions. FIGS. 3(b) and 3(c) illustrate these transitions for prior art emitter follower shifters. $V_{Out}$ shows a rapid positive transition when $V_{in}$ goes positive, but shows a delay when $V_{in}$ goes negative. The negative transition is limited by emitter bias current and load capacitance. Prior art techniques for speeding the negative transition involve increasing power to the circuit. This is undesirable and low power solutions to the problem of providing a level shifting circuit with minimal delays have been sought.

The prior art emitter follower of FIG. 3(a) consists of a transistor 30 biased in the forward active mode. The collector is connected 32 to a positive power supply so that the collector-base junction is reverse biased and kept out of saturation.

Other prior art level shifters used diodes to perform the level shifting operation. FIG. 4(a) illustrates a diode upshift circuit while FIG. 4(b) illustrates a diode downshift circuit. These circuits also have the disadvantage of having slow negative going and positive going transitions, respectively. These transitions can be accelerated by decreasing the value of the resistor $R_1$, but this creates disruptive DC currents.

The preferred embodiment of the present invention is described with reference to FIGS. 5(a) and 5(b) representing an improved level shifting circuit implemented as upshift and downshift circuits respectively. The preferred embodiment uses a capacitor shunted diode to reduce the signal delay by AC coupling the input and output of the device. AC coupling of the input and output signals speeds the pull-up of the output voltage $V^b$ without introducing unwanted DC effects. Most prior art systems stress low capacitance in the level shifting circuit, however, the novel combination of the present invention uses this higher capacitance to improve speed and reduce power. In an analogous manner, the downshift circuit of FIG. 5(b) includes diode $D_1$ shunted by capacitor $C_1$ to provide more rapid pull-down times for signal $V_b$.

A first alternate embodiment of the present invention is shown in FIG. 6(a). In this embodiment NPN transistor 40 is biased in the inverse active mode by connecting the emitter of the transistor through line 32 to the positive power supply. The emitter-base junction of transistor 40 is reverse biased and the output to load 36 is taken from the collector. Biasing current is established by the voltage levels and the biasing resistor. The improved $V_{out}$ response is shown in FIGS. 6(b) and 6(c). In the preferred embodiment, $R_{term}$ 34 is 50,000 ohms, $V_{in}$ is +0.3/+0.1 volts and $V_{out}$ is −0.5/−0.7 volts. It will be understood by VLSI practitioners that the circuits described in the various embodiments disclosed herein as using NPN transistors can be implemented in an analogous manner using PNP or other transistor structures.

The transistor collector-base junction has a greater area than the base-emitter junction in typical VLSI components. This larger area results in a substantially larger forward capacitance at similar current levels. The larger area also produces a lower junction voltage drop making biasing easier, an important advantage in low power applications such as cascode circuits. The inverse active biased level shifter of the present invention behaves like a large capacitor which can charge and discharge the load capacitance providing the function of the switching transistor in prior art level shifting applications. The inverse biased level shifter effectively AC couples the input to the output, reducing power requirements without harmful DC current effects. The preferred embodiment is implemented in silicon bipolar technologies where the proximity of the two junctions contributes to a relatively high area dependent inverse mode current gain. This gain minimizes the DC loading effects on the driving stage. As a result the power can be reduced to the emitter follower without increasing the signal delay through the stage.

A second embodiment of the present invention is shown in FIG. 7(a). This embodiment comprises a diode resistor network for low power level down shifting. The diode is formed from a forward biased collector-base junction of a transistor 44 in parallel with its base-emitter junction. Biasing current is established by voltage levels and the biasing resistor. FIGS. 7(b) and 7(c) show the improved output level response. In this embodiment $R_{term}$ 46 is typically 25,000 ohms while the voltage levels remain the same as in the previous example.

The above described area difference between the two junctions will cause most of the bias current to flow through the base-collector junction of the transistor. The large capacitance of the collector-base junction in parallel with the smaller base-emitter junction capacitance serves to charge and discharge the load capacitance replacing the switching transistor in prior art level shifting circuits. The diode level shifter effectively AC couples the input to the output. Additionally, the bias current through the level shifter now comes from the driving stage (typically a preceding emitter follower) rather than from the current source thereby increasing the speed performance of that device and improving level shift power efficiency.

The diode configuration of this embodiment is particularly advantageous in technologies where collector-emitter breakdown is of concern to the designers. This configuration is preferred over the inverse biased transistor of FIG. 6(a) in situations where the current gain is low for inverse mode transistors making inverse transistor operation poor.

An enhanced differential current switch (EDCS) upshift circuit embodying the present invention is shown in FIG. 8. Differential inputs A, A' are received at input terminals 60 62 and the upshifted differential outputs a, a' generated at terminals 64 66. High capacitance diode structures 68 70 perform the upshift operation. Each diode is connected through a resistor $R_C$ to positive power source $V_{CC}$.

The capacitors C1 and C2 can either be discrete components or may be the intrinsic capacitance of a given diode structure. The capacitance of C1 and C2 must be large compared to the effective input capacitance of TA1 and TA2 to minimize the AC signal swing degradation due to capacitive voltage division. In the preferred embodiment C1=C2= 0.5 picoFarad. Resistors $R_C$ are large enough to prevent the current flowing back to the previous stage from limiting fanout due to loading effects, however they are small enough that the current flowing through the resistors is large compared to the current drawn by the base of TA1/TA2 in the on state. In the preferred embodiment $R_C$ values of 50,000 ohms are used. The diodes D1 D2 have a low junction voltage to help reduce the signal swing degradation. This circuit has very short delays due to the AC coupling effect.

The high capacitance diode structures 68 70 can be implemented using diode connected transistors in place of discrete diodes and capacitors. Alternate diode connected transistors are shown in FIGS. 9(a) through 9(c). The transistors are connected to increase the effective capacitance between the base and collector nodes. The configuration shown in FIG. 9(a) is commonly used in switching applications because of its low $C_{cb}$. The configurations shown in FIGS. 9(b) and 9(c) are well suited for level shifting operations. Their $C_{cb}$ values are two or three orders of magnitude higher than that of FIG. 9(a), particularly at higher currents. The configuration of FIG. 9(b) has a junction voltage and capacitance significantly lower than that of FIG. 9(c), and is favored for level shifting unless the effective capacitance of TA1 TA2 is high.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

We claim:

1. A level shift circuit for a logic circuit for translating a first voltage level binary pulse signal from said first voltage level at an input node to a second voltage level at an output node coupled to a capacitive load, said circuit comprising:

a resistor connected to a DC supply voltage;

diode means with a capacitance substantially higher than that of the capacitive load for creating the voltage level translation connected in series with said resistor and having a first and a second terminal, wherein said second terminal forms said output node at the point of interconnection of said resistor and said diode means;

said first voltage level binary pulse signal connected to said diode means at said first terminal which is said input node, and said second voltage level pulse signal appearing at said output node.

2. The level shift circuit of claim 1, wherein said diode means comprises a diode and a capacitor connected between said first and second terminals to shunt said diode.

3. The level shift circuit of claim 1, wherein said diode means comprises a diode-connected transistor.

4. The level shift circuit of claim 1 wherein said diode means is conductive from said first to said second terminal forming a downshift circuit.

5. The level shift circuit of claim 1 wherein said diode means is conductive from said second to said first terminal forming an upshift circuit.

6. A level shift circuit of a binary logic circuit for translating a first voltage level pulse signal to a second lower voltage level pulse signal, said circuit comprising:

a bipolar transistor, having a base, emitter and collector said base being connected to said first voltage level pulse signal and said emitter connected to a common potential;

a terminating resistor connected to the collector of said transistor at a collector node;

a capacitive load which is substantially lower in capacitance than the base to collector junction of said bipolar transistor connected to the collector node of said first transistor;

said transistor being biased so that the emitter-base junction of said transistor is reverse biased.

7. A level shift circuit of a binary logic circuit for translating a first voltage level pulse signal to a second voltage level pulse signal, said circuit comprising:

a first bipolar transistor, said transistor forward biased at the collector-base junction and having its collector and emitter shorted;

a terminating resistor connected to the collector of said first bipolar transistor at a collector node;

a load which is substantially lower in capacitance than the base to collector junction of said bipolar transistor connected to said collector node in parallel with said resistor;

said first voltage level pulse signal connected to said base of said transistor and said second voltage level pulse signal appearing at said collector node.

8. An upshift circuit of a binary logic circuit for shifting a differential pair of input signals at a first signal level to a second differential pair of output signals to be supplied to a capacitive load at a second signal level, the circuit comprising:

first and second input terminal means for receiving said differential pair of input signals;

first and second diode means with a capacitance which is substantially higher in capacitance than the capacitive load, for shifting the signal level, said high capacitance diode means being connected to said first and second input terminal means;

first and second resistors connected to said first and second diode means at respective connection nodes and to a common source potential, wherein said second differential pair appears at said connection nodes.

9. The circuit of claim 8 wherein said first and second diode means comprise a diode and a capacitor connected as a shunt across said diode.

10. The circuit of claim 8 wherein said first and second diode means comprise a diode connected transistor.

11. The circuit of claim 10 wherein said diode connected transistor comprises a bipolar transistor having a base, collector and emitter and wherein said collector and emitter shorted, said base is connected to said input terminal and said emitter is connected to said connection node.

12. The circuit of claim 10 wherein said diode connected transistor comprises a bipolar transistor with a base, collector and emitter and wherein said base and emitter are shorted and said emitter is connected to said input terminal and said collector to said connection node.

13. The circuit of claim 10 wherein said diode connected transistor comprises a bipolar transistor with a base, collector and emitter and wherein said base and collector are shorted and said collector is connected to said input terminal and said emitter to said connection node.

14. The level shift circuit of claim 6 wherein said capacitive load comprises a base-emitter junction of a second bipolar transistor.

15. The level shift circuit of claim 7 wherein said capacitive load comprises a base-emitter junction of a second bipolar transistor.

16. The level shift circuit of claim 8 wherein said capacitive load comprises the base-emitter junction of a bipolar transistor.

17. A level shifting circuit in a logic switching circuit for changing the magnitude of a binary information pulse from one level, supplied to the input to the level switching circuit, to a different level, at the output of the level switching circuit, which different level is for driving the base-emitter junction of a transistor in the logic switching circuit, said level shifting circuit comprising:

a resistive means;

voltage shifting diode means connected in series with the resistive means across the input to the level shifting circuit with the common point of the voltage shifting diode means and said resistive means being the output of the level shifting circuit, said output being connected to the base of said transistor, wherein the magnitude of the capacitance of said voltage shifting diode means is substantially higher than the magnitude of the capacitance of the base-emitter junction of said transistor to reduce power consumption of the level shifting circuit and to reduce the response time of the logic circuit to the binary information pulse.

18. The level shifting circuit of claim 17 wherein a semiconductor junction forming said voltage shifting diode is substantially larger than the base-emitter junction of the transistor to obtain the higher capacitance for the voltage shifting diode.

19. The level shifting circuit of claim 18 wherein said junction of said voltage shifting diode is the base-collector junction of a second transistor.

20. The level shifting circuit of claim 19 wherein the base and emitter of said second transistor are shorted together.

21. The level shifting circuit of claim 19 wherein the emitter and collector of said second transistor are shorted together.

22. A level shifting circuit for use in connection with a logic switching circuit for changing the magnitude of an information pulse from one level, supplied to the input to the level switching circuit, to a different level, at the output of the level switching circuit, which different level is for driving a capacitive load in the logic switching circuit, said circuit comprising:

a resistive means;

voltage shifting diode means connected in series with the resistive means across the input to the level shifting circuit with the common point of the voltage shifting diode means and said resistive means being the output of the level shifting circuit, which output is connected to said capacitive load wherein the magnitude of the capacitance of said voltage shifting diode means is substantially higher than the magnitude of the capacitance of the capacitive load to reduce power consumption of the logic circuit and to reduce the response time of the logic circuit to the information pulse.

23. The level shifting circuit of claim 22 wherein said capacitive load is a base-emitter junction of a bipolar transistor in the logic switching circuit and a semiconductor junction forming said voltage shifting diode is substantially larger than the base to emitter junction of the transistor to obtain the higher capacitance for the voltage shifting diode.

24. The level shifting circuit of claim 23 wherein said junction of said voltage shifting diode is the base-collector junction of a second transistor.

25. The level shifting circuit of claim 24 wherein the base and emitter of said second transistor are shorted together.

26. The level shifting circuit of claim 24 wherein the emitter and collector of said second transistor are shorted together.

* * * * *